US006238986B1

(12) United States Patent
Kepler et al.

(10) Patent No.: US 6,238,986 B1
(45) Date of Patent: May 29, 2001

(54) FORMATION OF JUNCTIONS BY DIFFUSION FROM A DOPED FILM AT SILICIDATION

(75) Inventors: Nick Kepler, Saratoga, CA (US); Karsten Wieczorek, Reichenberg-Boxdorf (DE); Larry Wang, San Jose; Paul Raymond Besser, Sunnyvale, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/187,427

(22) Filed: Nov. 6, 1998

(51) Int. Cl.$^7$ ..................................................... H01L 21/28
(52) U.S. Cl. .......................... 438/301; 438/683; 438/372; 438/558; 438/560
(58) Field of Search ..................................... 438/621, 598, 438/655, 738, 751, 735, 157, 153, 154, 783, 559, 649, 430, 664, 682

(56) References Cited

U.S. PATENT DOCUMENTS

| 4,378,628 | * | 4/1983 | Levinstein et al. ..................... | 29/571 |
| 5,352,631 | * | 10/1994 | Sitaram et al. ....................... | 437/200 |
| 5,899,720 | * | 5/1999 | Mikagi .............................. | 438/303 |
| 5,980,265 | * | 11/1999 | Tischler ............................. | 437/185 |
| 5,981,372 | * | 11/1999 | Goto et al. .......................... | 438/621 |
| 5,985,768 | * | 11/1999 | Speranza et al. ..................... | 438/783 |

OTHER PUBLICATIONS

Materials and Bulk Processes, "Doping Technologies," The National Technology Roadmap for Semiconductors (1994), pp. 118–121.

H. Jiang, et al., "Ultra Shallow Junction Formation Using Diffusion form Silicides," J. Electrochem. Soc., vol. 139, No. 1, Jan. 1992, pp. 196–218.

* cited by examiner

Primary Examiner—Mary Wilczewski
Assistant Examiner—David Goodwin

(57) ABSTRACT

High integrity shallow source/drain junctions are formed employing cobalt silicide contacts. A layer of cobalt and a cap layer of titanium or titanium nitride are deposited on a substrate above intended source/drain regions, followed by silicidation. Embodiments include low-temperature rapid thermal annealing to form a high-resistivity phase cobalt silicide, removing the cap layer, depositing a doped film on the first phase cobalt silicide, and heating, as by high-temperature rapid thermal annealing, to form a low-resistance cobalt silicide during which impurities from the doped film diffuse through the cobalt silicide into the substrate to form source/drain regions having junctions extending into the substrate a constant depth below the cobalt silicide/silicon substrate interface. In another embodiment, impurities are diffused from the doped film to form source/drain regions and self-aligned junctions following formation of the low-resistance phase cobalt silicide. The formation of source/drain junctions self-aligned to the cobalt silicide/silicon substrate interface prevents junction leakage while allowing the formation of cobalt silicide contacts at optimum thickness to avoid parasitic series resistances, thereby facilitating reliable device scaling.

22 Claims, 8 Drawing Sheets

FORMATION OF JUNCTIONS BY DIFFUSION FROM A DOPED FILM AT SILICIDATION

RELATED APPLICATIONS

This application contains subject matter related to subject matter disclosed in copending U.S. patent application Ser. Nos. 09/187,527 and 09/318,824.

FIELD OF THE INVENTION

The present invention relates to a method of manufacturing a semiconductor device comprising refractory metal silicide contacts to source/drain and silicon gate regions. The present invention has particular applicability in manufacturing reliable high density semiconductor devices with submicron design features, shallow junction depths and cobalt silicide contacts to source/drain regions.

BACKGROUND ART

Current demands for high density and performance associated with ultra large scale integration require design rules of about 0.18 microns and under, increased transistor and circuit speeds and improved reliability. As device scaling plunges into the deep sub-micron ranges, it becomes increasingly difficult to maintain performance and reliability.

In the manufacture of conventional complementary metal oxide semiconductor (CMOS) devices, referring to FIG. 1A, isolation regions 110, called field oxide regions, are formed in a semiconductor substrate 100 of silicon dioxide by local oxidation of silicon (LOCOS) or by shallow trench isolation (STI). A conductive gate 130, such as polysilicon, is also formed on substrate 100, with a gate oxide layer 120 in between. Dielectric spacers 140 are formed on sidewalls of the gate 130, and source/drain regions 150 are formed on either side of gate 130 by implantation of impurities.

As gate lengths are reduced to below $0.5\mu$, refractory metal silicide layers, such as titanium silicide, are typically formed over source/drain regions 150 and gate 130 to reduce the sheet resistance of these components, thereby improving device performance. Referring to FIG. 1B, a titanium layer 160 is deposited, as by sputtering, over the entire substrate 100 as well as field oxide 110, gate 130 and spacers 140. A low temperature rapid thermal anneal (RTA) reaction creates a first-phase titanium silicide (C49) on the exposed silicon of gate 130 and source/drain regions 150. The unreacted titanium over field oxide 110 and spacers 140 is then removed, and a high temperature RTA reaction changes the first-phase titanium silicide into a low-resistance second-phase titanium silicide 170 (C54), as shown in FIG. 1C. Since the titanium silicide does not form on field oxide 110 or spacers 140, it is self-aligned to the gate 130 and source/drain regions 150. Hence, the titanium silicide formed in this process is known as "titanium salicide" (self-aligned silicide).

Titanium salicide is effective in decreasing sheet resistance if the gate length is greater than about $0.25\mu$. At a gate length of about $0.25\mu$ the titanium silicide sheet resistance rises dramatically due to narrow-line effects; that is, the low-resistance silicide C54 does not completely form because first-phase C49 grains are very large (about $0.5\mu$), and hence there are fewer nucleation sites on the gate to nucleate the low resistance silicide C54 during the high temperature RTA.

To maintain low sheet resistance as gate lengths are decreased in scale below about $0.25\mu$, cobalt is typically used instead of titanium in silicide formation. Cobalt silicide does not display the undesirable narrow-line effects of titanium silicide because the conversion from its first-phase cobalt silicide to its low-resistance second-phase cobalt silicide is a diffusion reaction, rather than the nucleation and growth reaction as with titanium silicide and, therefore, the relationship of grain size to gate size is not a limiting factor.

However, the cobalt salicide process has a drawback in that cobalt silicide is more likely than titanium silicide to cause source and drain junction leakage, which can result in unacceptably high power dissipation as well as functional failure. This problem becomes especially critical as gate lengths are scaled below $0.25\mu$, and source and drain junctions are typically made shallower to prevent transistor short-channel effects. Since shallow junctions are more susceptible to junction leakage than deep junctions, cobalt silicide related junction leakage effectively limits CMOS device scaling.

A cause of this junction leakage, referring to FIG. 2, is the unevenness of the interface between the cobalt silicide 210 and the silicon source/drain regions 220, which results in an insufficient distance between portions of the bottom of the cobalt silicide 210 and source/drain junctions 220a. When a junction 220a is biased, a depletion region (i.e., an area depleted of free carriers) is formed which extends on either side of the junction 220a. Since the distance the depletion region spreads from the junction 220a is inversely proportional to the doping of the region, and source/drain region 220 is more heavily doped than substrate 200, the depletion region spreads mainly into substrate 200. Nevertheless, if cobalt silicide 210 extends into the depletion spread, leakage can occur as carriers are swept across this highly charged region. Junction integrity can be maintained by providing a large enough distance between junction 220a and the interface of silicide 210 and source/drain region 220; i.e., by reducing the thickness of cobalt silicide 210. However, reducing its thickness increases the sheet resistance of cobalt silicide 210, thus reducing its effectiveness.

There exists a need for a method of manufacturing a semiconductor device with a low-resistance refractory metal silicide layer over its source/drain regions which does not cause junction leakage.

SUMMARY OF THE INVENTION

An advantage of the present invention is a method of manufacturing a semiconductor device having a metal silicide layer over its source/drain regions which does not adversely affect junction integrity.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises forming a metal layer on a main surface of a semiconductor substrate containing silicon; forming a cap layer on the metal layer; heating to form a layer of metal silicide; etching to remove the cap layer; forming a doped layer having impurities on the metal silicide layer; and heating to reduce the resistivity of the silicide and to diffuse the impurities through the metal silicide layer into the substrate to form source/drain regions having a junction depth below the metal silicide layer.

Additional advantages of the present invention will become readily apparent to those skilled in this art from the following detailed description, wherein only the preferred embodiment of the invention is shown and described, simply by way of illustration of the best mode contemplated for carrying out the invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The present invention addresses and solves problems stemming from conventional methods of forming low resistance cobalt silicide contacts on source/drain regions, particularly source/drain regions having ultra-shallow junction depth such as about 2000 Å and under; e.g., 500 Å and under. Such conventional cobalt silicide methodology results in an uneven interface between the cobalt silicide contacts and the silicon of the source/drain regions and a less than optimal distance between the cobalt silicide and the shallow source/drain junctions, thus causing junction leakage and preventing cost-effective device scaling.

According to the methodology of the present invention, a layer of metal, e.g., cobalt, is deposited on a substrate before forming the source/drain implants, i.e., above intended source/drain regions, field oxide regions, gates and spacers. A cap layer, e.g., titanium, is deposited on the metal layer. As used throughout the present disclosure and claims, the term "substrate" denotes a semiconductor substrate or an epitaxial layer formed on the semiconductor substrate. Initial silicidation is then performed, as by RTA, to form a first-phase cobalt silicide. After stripping off the unreacted metal and cap layer, a doped film is deposited on the first-phase cobalt silicide, and final silicidiation is carried out, as by RTA, to form low-resistance cobalt silicide contacts while diffusing the dopants to form source/drain regions having a junction depth which is substantially evenly spaced from the metal silicide/silicon interface. In another embodiment of the present invention, the two-step RTA silicidation process is carried out to form the low-resistance silicide contacts, followed by deposition of a doped layer and a separate heating step to diffuse impurities from the doped film through the cobalt silicide and into the substrate to form the source/drain regions having a shallow junction, thereby enabling the time and temperature of the impurity diffusion step to be optimized separately from the silicidation RTA process.

In all embodiments of the present invention, the impurities, which gain mobility when the doped film is heated, readily diffuse out of the doped film and diffuse through the cobalt silicide into the substrate, as cobalt silicide does not have as great an affinity for dopants as the substrate silicon. Due to the high diffusivity of the impurities in the cobalt silicide, the impurities form a shallow source/drain junction self-aligned to the cobalt silicide/silicon interface, thus avoiding junction leakage independently of the interface shape and the cobalt silicide thickness.

Figure 1A:
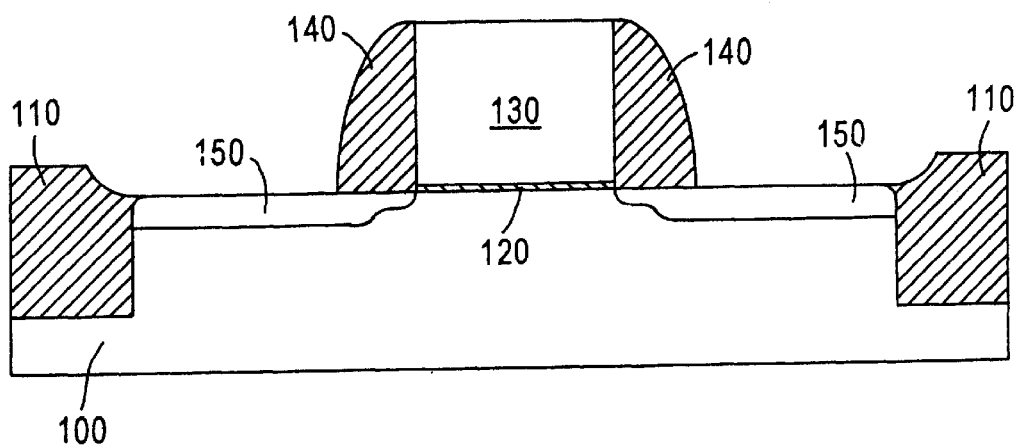
FIGS. 1A–1C schematically illustrate sequential phases of a conventional salicide technique.
Figure 1B:
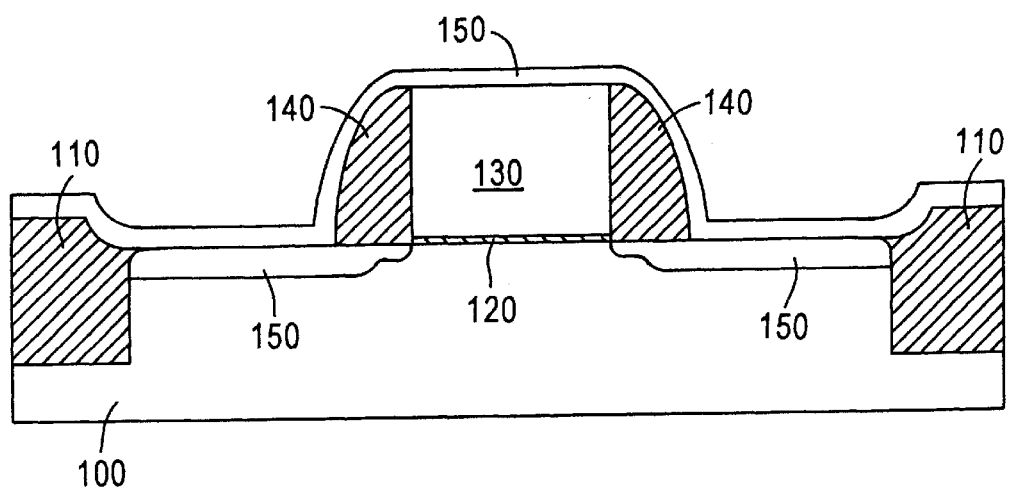
Figure 1C:
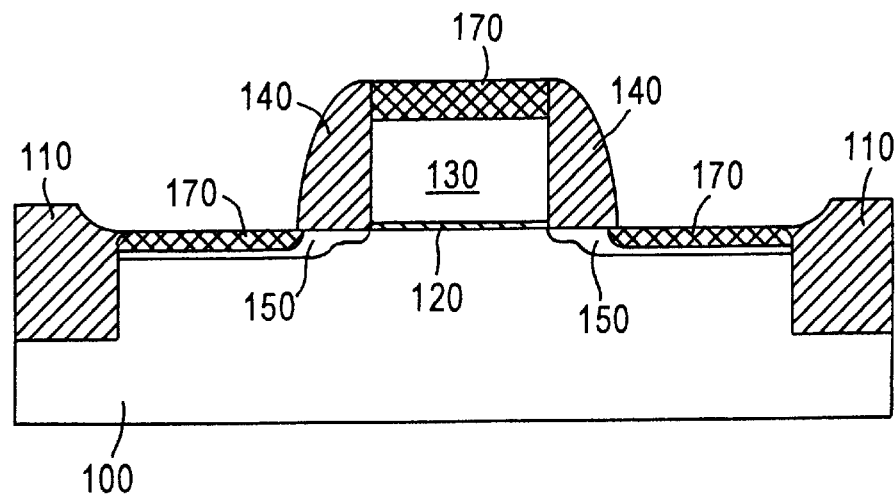
Figure 2:
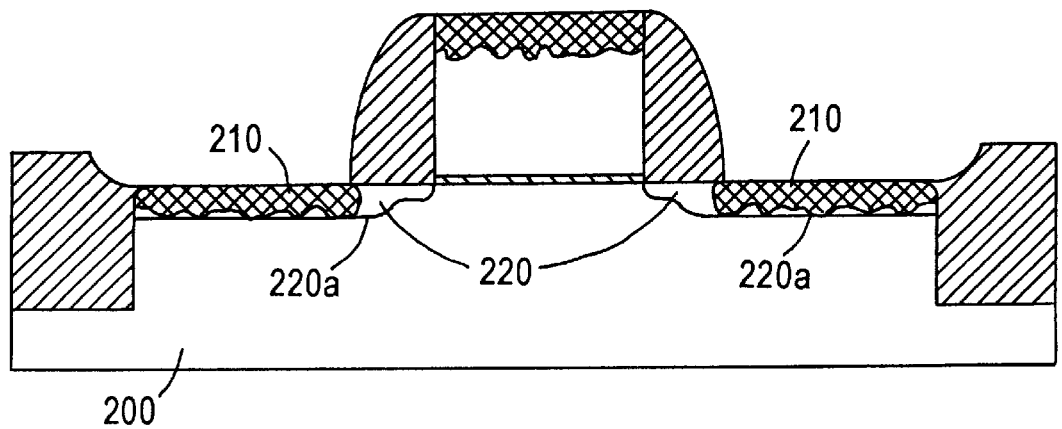
FIG. 2 depicts the results of a conventional method of cobalt salicide formation.
Figure 3A:
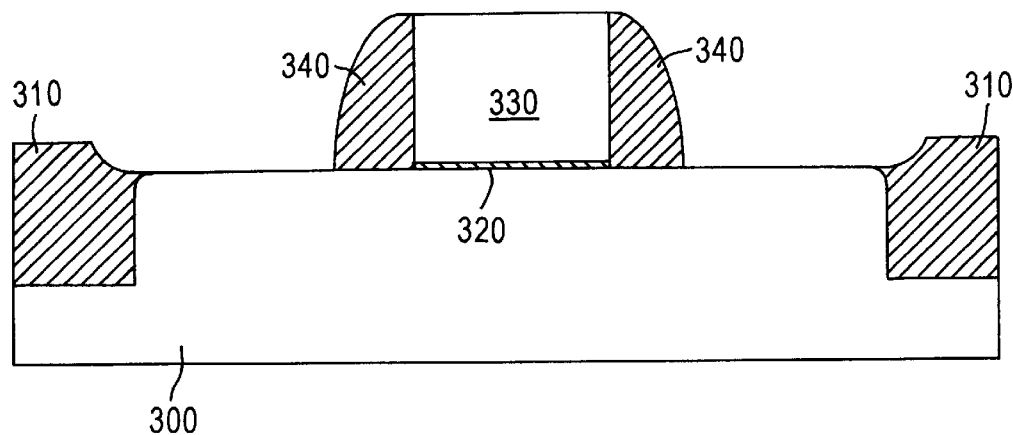
FIGS. 3A–3G schematically illustrate sequential phases of a method in accordance with an embodiment of the present invention.

An embodiment of the present invention is illustrated in FIGS. 3A–3G. As shown in FIG. 3A, field oxide regions 310 are formed on substrate 300, as by LOCOS or STI, followed by a thermally grown gate oxide layer 320 and a polysilicon gate 330, typically deposited by low pressure chemical vapor deposition (LPCVD), masked and etched. Dielectric spacers 340 are thereafter formed on sidewalls of gate 330, such as silicon dioxide or silicon nitride deposited by LPCVD and anisotropically etched.

Figure 3B:
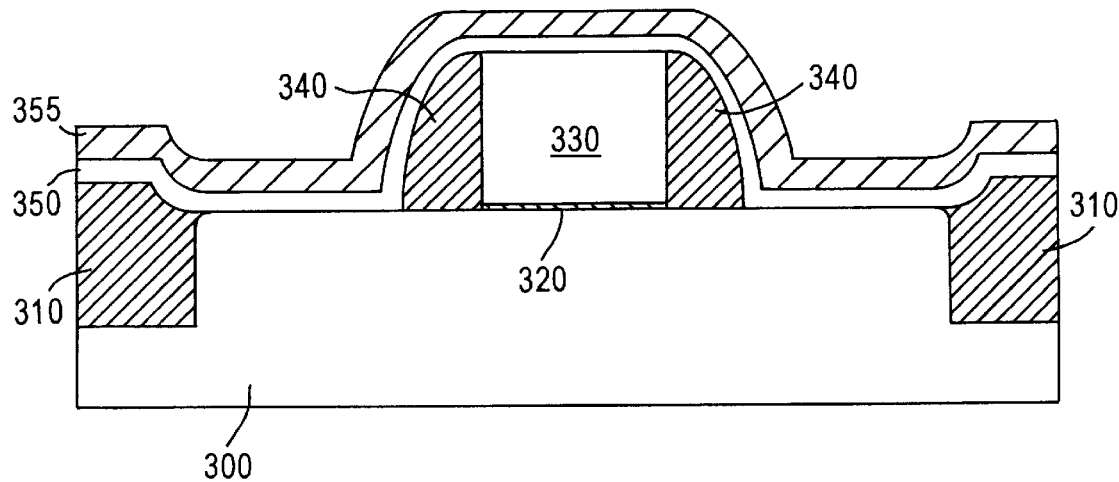
Figure 3C:
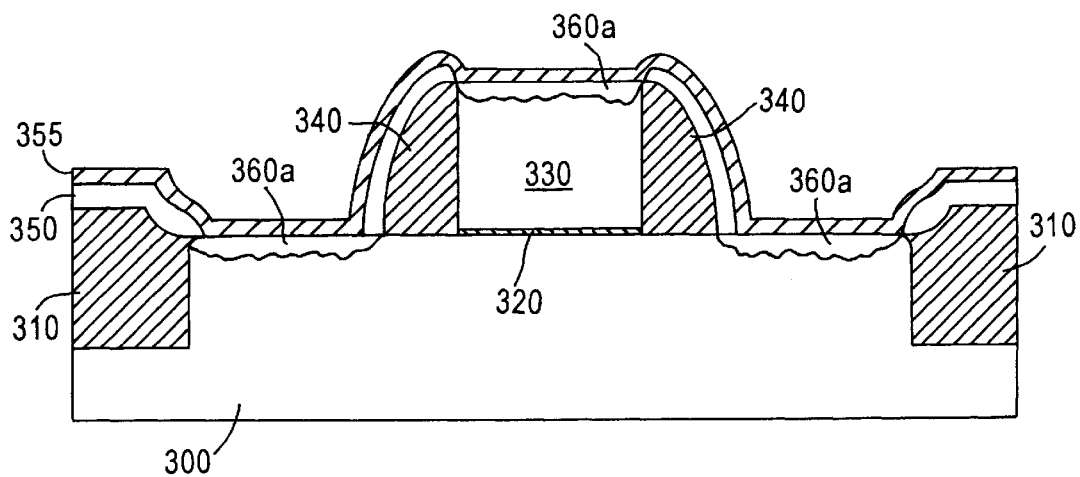

Referring to FIG. 3B, a layer of cobalt 350 is deposited across substrate 300, including field oxide regions 310, spacers 340 and gate 330, as by sputtering. A cap layer 355 of titanium, titanium nitride or a derivative thereof is then deposited on cobalt layer 350, as by sputtering to a thickness of about 50 Å, to prevent contaminants such as ambient oxygen or nitrogen from interfering with the subsequent silicidation reaction between cobalt 350 and substrate 300. Next, referring to FIG. 3C, a low temperature RTA is performed at about 400° C. to about 600° C.; e.g., about 470° C., to cause portions of cobalt layer 350 above the silicon of gate 330 and substrate 300 to react and form a first phase cobalt silicide 360a. Cap layer 355 and portions of cobalt layer 350 above field oxide regions 310 and dielectric spacers 340 do not react to form a silicide, so cobalt silicide 360a is self-aligned to gate 330 and the intended source/drain regions of substrate 300. Thereafter, cap layer 355 and the unreacted portions of cobalt layer 350 above field oxide regions 310 and spacers 340 are stripped away, as by wet etching.

Figure 3D:
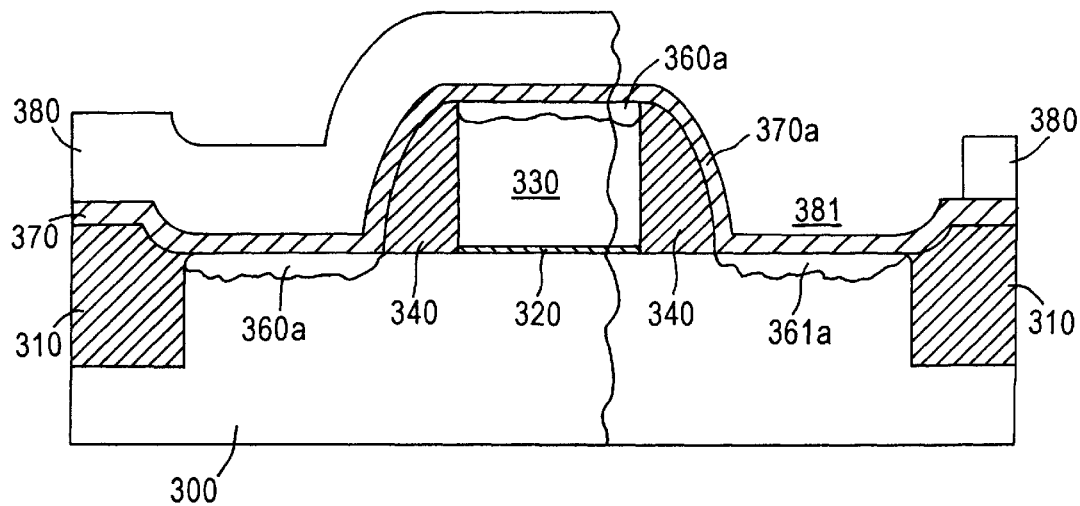

A first doped film 370 is then deposited on cobalt silicide 360a, as by LPCVD (see FIG. 3D). First doped film 370 is doped with a first conductivity type of impurities, either n-type impurities such as phosphorus or arsenic, or p-type impurities such as boron or indium, which will subsequently dope substrate 300 to form source/drain regions having ultra-shallow junctions. First doped film 370 is formed of a material which allows the impurities to diffuse out, and should be a dielectric if it is not to be stripped off after diffusion of the impurities. Suitable materials include silicon dioxide, silicon oxynitride or silicon nitride.

Figure 3E:
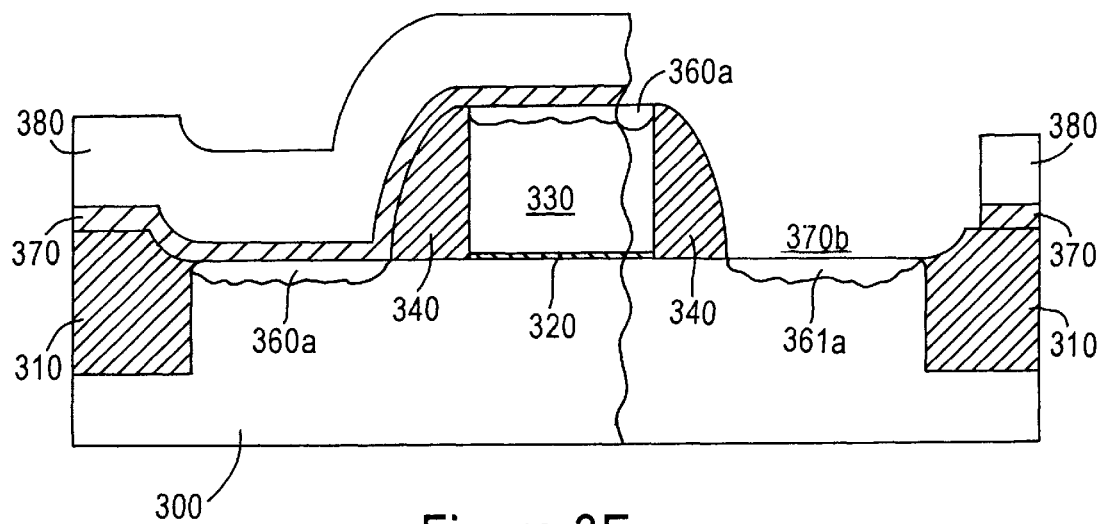
Figure 3F:
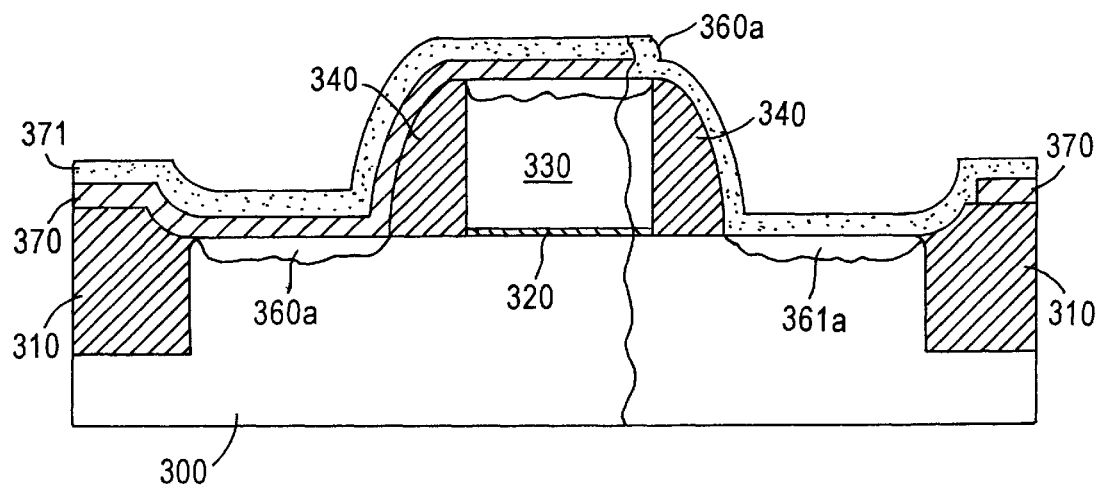

A photoresist mask 380 is formed on first doped film 370, and has openings 381 to expose portions 370a of first doped film 370 corresponding to selected portions 361a of cobalt silicide 360a which are not to receive dopant from first doped film 370. First doped film 370 is then etched, as depicted in FIG. 3E, to form through-holes 370b in first doped film 370, thus exposing selected portions 361a of cobalt silicide 360a, and a second doped film 371 is deposited over selected portions 361a and over first doped film 370, as depicted in FIG. 3F. Second doped film 371 is doped with a second conductivity type of impurities different than the first impurity type of first doped film 370, and like first doped film 370 can be silicon dioxide, silicon oxynitride or silicon nitride, deposited as by LPCVD, contain impurities such as boron, arsenic, phosphorus, or indium depending on its impurity type, and must be a dielectric if it is to remain on the device after diffusion of the impurities.

Figure 3G:
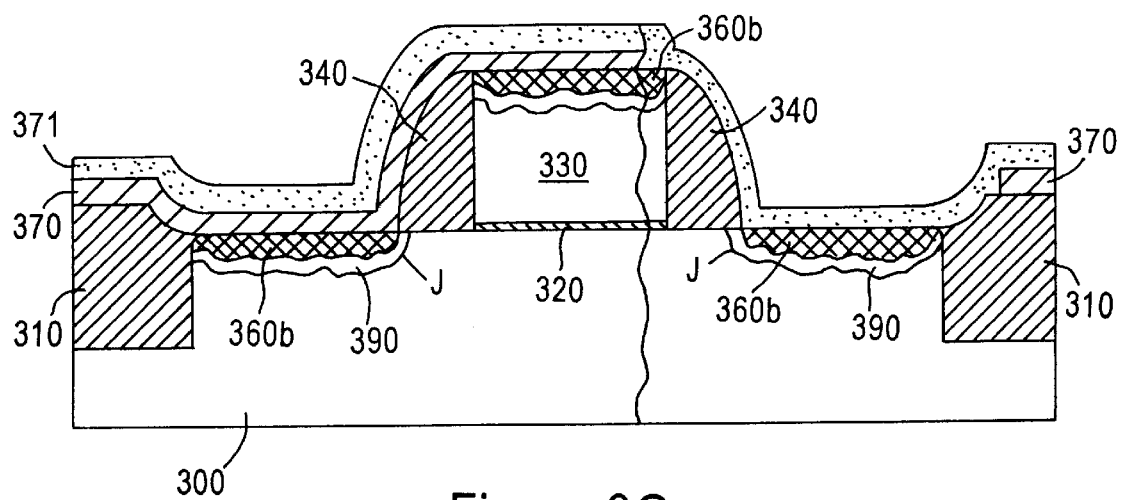

A high-temperature RTA is next performed at about 700° C. to about 900° C.; e.g., about 825° C., to convert high resistivity cobalt silicide 360a into a second phase low-resistance cobalt silicide 360b and to diffuse impurities out of first and second doped films 370, 371, through cobalt silicide 360b and into gate 330 and source/drain regions 390 in substrate 300 to form shallow junctions J at a depth of about 2000 Å or less; e.g., about 500 Å (see FIG. 3G). Because the impurities readily diffuse through cobalt silicide 360b, junctions J are self-aligned to the cobalt silicide/silicon interface and substantially equidistant therefrom; i.e., the shape of junctions J substantially correspond to the shape of the bottom of cobalt silicide 360b, thus assuring a sufficient distance between the bottom of cobalt silicide 360b and junction J to avoid junction leakage, regardless of the interface shape and the thickness of cobalt silicide 360b.

Each of the first doped film 370 and the second doped film 371 have an impurity concentration great enough to form junctions J; i.e., an impurity concentration of about 1% to about 10%, or about $6 \times 10^{21}$ cm$^{-2}$ to about $6 \times 10^{22}$ cm$^{-2}$.

Second doped film 371 partially overlays first doped film 370, as depicted in FIGS. 3F and 3G; however, the second conductivity type of impurities, initially carried by second doped film 371, should not be allowed to diffuse through the first doped film 370 (during the low temperature RTA) and counter-dope source/drain regions 390. The diffusion of the second conductivity type of impurities through first doped film 360 is substantially prevented if the diffusion process is completed before an unacceptably large amount of the second conductivity type of impurities has sufficient time to diffuse through first doped film 370. This can be achieved by providing a first conductivity type of impurities (carried by first doped film 370) having a higher rate of diffusion than the second conductivity type of impurities; for example, providing first doped film 370 having p-type impurities, and second doped film 371 having n-type impurities. Additionally, unwanted diffusion of the second conductivity type of impurities through first doped film 370 can be reduced by depositing first doped layer 370 to a greater thickness than second doped layer 371.

Disadvantageous diffusion of the second conductivity type of impurities through first doped film 370 can also be substantially prevented by providing the first conductivity type of impurities with a concentration in first doped film 370 higher than a concentration of the second conductivity type of impurities in second doped film 371, since a quantity of impurities sufficient to adversely counter-dope source/drain regions 390 cannot diffuse from second doped film 371 through first doped film 370 if first doped film 370 contains substantially more dopant than second doped film 371.

Figure 4A:
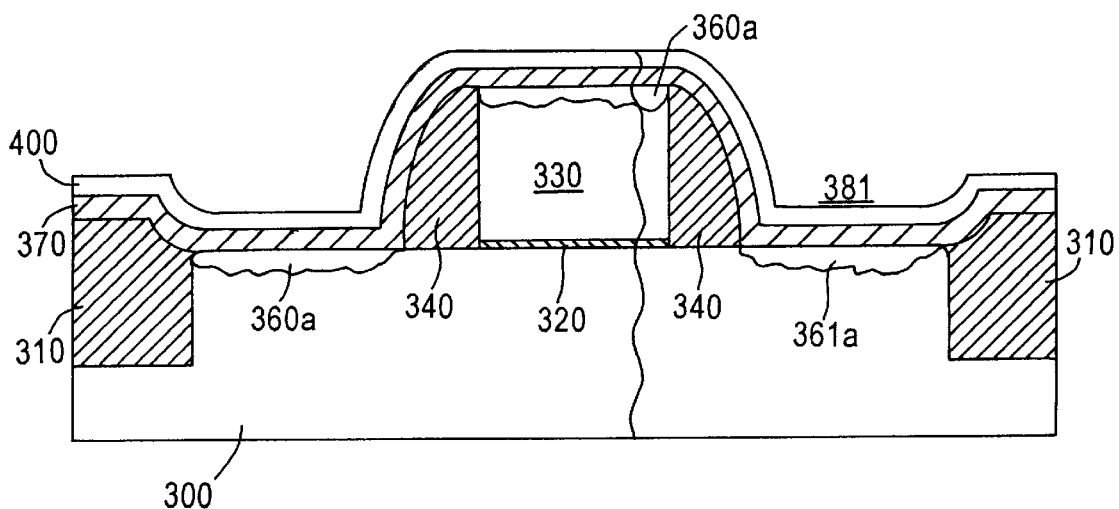
FIGS. 4A–4B schematically illustrate sequential phases of a method in accordance with another embodiment of the present invention.
Figure 4B:
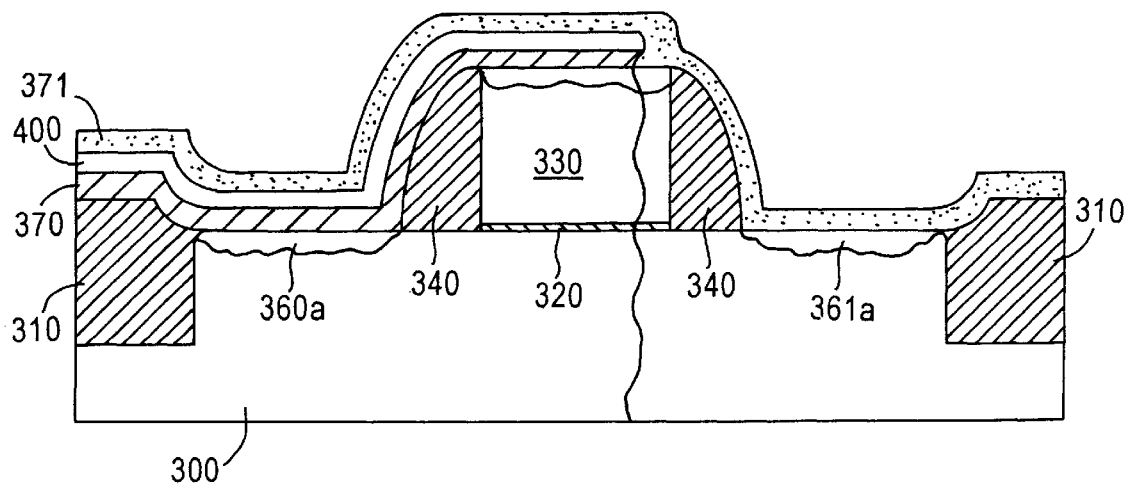

Another way to prevent the second conductivity type of impurities from diffusing through first doped film 370 is to form first doped film 370 of silicon oxynitride or silicon nitride and the second doped film 371 of silicon dioxide. Nitrogen in first doped layer 370 substantially blocks the diffusion of dopants from second doped film 371. In another embodiment of the present invention, as shown in FIG. 4A, a skin of nitrogen 400 is grown on first doped film 370, as by annealing first doped film 370 in a nitrogen atmosphere after first doped film 370 has been deposited, then depositing second doped film 371 (see FIG. 4B). Nitrogen effectively blocks the diffusion of impurities, such as boron. Thus, it is advantageous to form first doped film 370 with n-type impurities (e.g., silicon dioxide doped with arsenic), grow nitrogen skin 400 on first doped film 370, then form second doped film 371 with boron as the second type of impurities. Nitrogen skin 400 between first and second doped films 370, 371 substantially blocks diffusion of the boron out of second doped film 371 into first doped film 370.

Figure 5A:
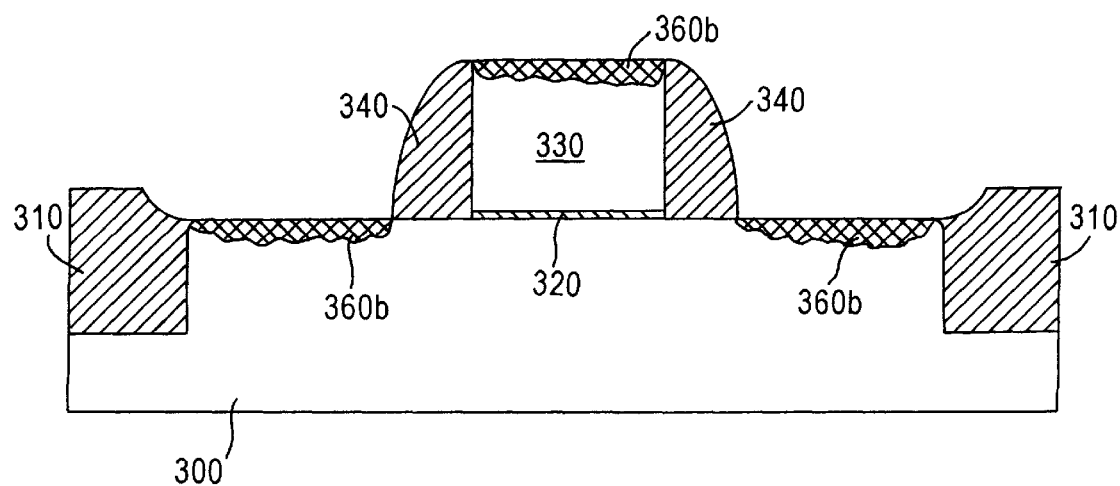
FIGS. 5A–5B schematically illustrate sequential phases of a method in accordance with still another embodiment of the present invention.
Figure 5B:
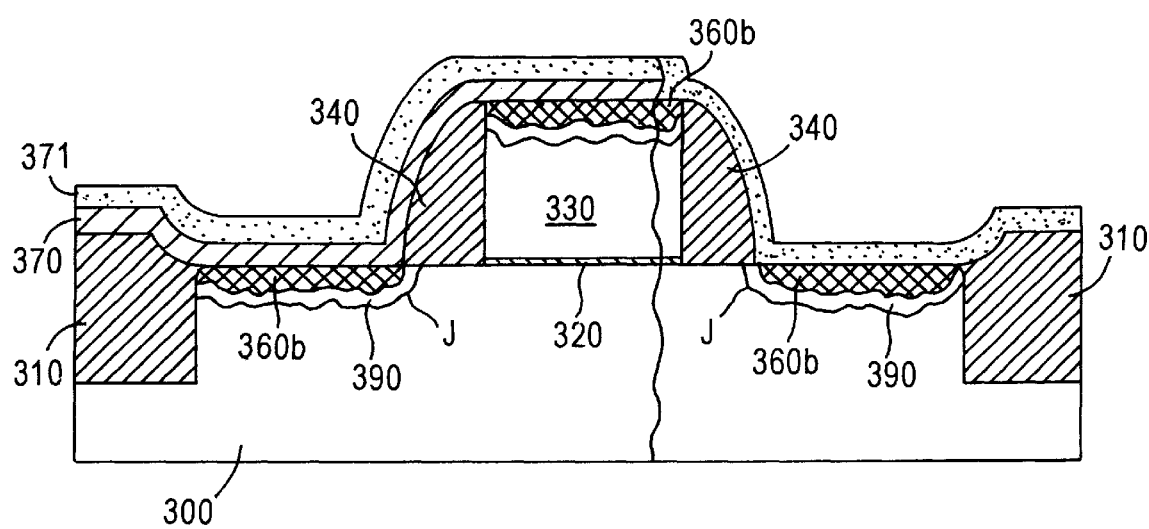

In another embodiment of the present invention, as illustrated in FIGS. 5A–5B, doped films are deposited and impurities diffused to form source/drain regions and junctions after the second-phase cobalt silicide 360b formation. As described above with reference to FIGS. 3A–3C, a cobalt layer 350 and cap layer 355 are deposited and subjected to a low-temperature RTA to form cobalt silicide 360a, and the cap layer 355 and unreacted cobalt 350 are stripped off. As shown in FIG. 5A, a high-temperature RTA is then performed to convert cobalt silicide 360a into cobalt silicide 360b. Next, a first doped film 370 is deposited, masked and etched, then a second doped film 371 is formed as disclosed above, and a heating step is carried out at about 600° C. to about 850° C. for about 15 seconds to about 120 seconds; e.g., about 750° C. for about 45 seconds, to diffuse impurities out of first and second doped films 370, 371, through cobalt suicide 360b and into gate 330 and source/drain regions 390 below cobalt silicide 360b to form shallow junctions J (see FIG. 5B). As in the previously described embodiments, because the impurities readily diffuse through cobalt silicide 360b, junctions J are self-aligned to the cobalt silicide/silicon interface and substantially equidistant therefrom, thus assuring a sufficient distance between the bottom of cobalt silicide 360b and junction J to avoid junction leakage, regardless of the interface shape and the thickness of cobalt silicide 360b. This embodiment of the present invention enables optimization of the temperature and time of diffusion of the impurities from first and second doped films 370, 371 into substrate 300 separately from the high-temperature RTA of the silicidation process.

The methodology of the present invention enables formation of shallow source/drain regions having ultra-shallow junctions of high integrity with cobalt silicide contacts of optimized thickness thereon. By depositing cobalt prior to forming the source/drain implants, and then diffusing impurities through the cobalt silicide layer to form the source/drain regions during or after silicide formation, ultra-shallow junctions are formed with a constant spacing from the uneven cobalt silicide/silicon interface. Unlike conventional practices, the present invention enables cobalt silcide formation which is sufficiently spaced apart from the source/drain junctions to avoid junction leakage, regardless of the shape of the cobalt silicide/silicon interface or the thickness of the cobalt suicide layer. Thus, the present methodology facilitates device scaling by enabling the formation of low-resistance silicided source/drain regions having ultra-shallow junctions without silicide-related junction leakage. The present invention is applicable to the manufacture of various types of semiconductor devices having silicided source/drain regions, particularly high density semiconductor devices having a design rule of about 0.18μ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:

forming a metal layer on a main surface of a semiconductor substrate containing silicon;

forming a cap layer on the metal layer;

heating at a first temperature to form a first-phase metal silicide layer;

etching to remove the cap layer;

forming a doped layer having impurities on the first-phase metal silicide layer; and heating at a second temperature greater than the first temperature to:

convert the first-phase metal silicide layer to a second-phase metal silicide layer having a resistivity lower than that of the first-phase metal silicide layer; and diffuse the impurities through the second-phase metal silicide layer into the substrate to form source/drain regions having a junction depth below the second-phase metal silicide layer.

2. The method according to claim 1, wherein the metal silicide layer has an irregular interface with the substrate and the source/drain junctions are substantially equidistant from the irregular interface.

3. The method according to claim 1, wherein the metal layer comprises cobalt, the first-phase metal silicide comprises CoSi and the metal silicide comprises $CoSi_2$.

4. The method according to claim 3, comprising:

heating at the first temperature by rapid thermal annealing at about 400° C. to about 600° C.; and heating at the second temperature by rapid thermal annealing at about 700° C. to about 900° C.

5. The method according to claim 4, comprising heating at the first temperature by rapid thermal annealing at about 470° C., and heating at the second temperature by rapid thermal annealing at about 825° C.

6. The method according to claim 2, wherein the source/drain junctions have a depth of about 2000 Å or less.

7. The method according to claim 6, wherein the source/drain junctions have a depth of about 500 Å or less.

8. The method according to claim 1, wherein the doped layer is a dielectric layer.

9. The method according to claim 1, comprising forming the doped layer with an impurity concentration of about 1% to about 10%.

10. The method according to claim 1, comprising forming the doped layer with an impurity concentration of about $6 \times 10^{21}$ $cm^{-2}$ to about $6 \times 10^{22}$ $cm^{-2}$.

11. A method of manufacturing a semiconductor device, which method comprises:

forming a metal layer on a main surface of a semiconductor substrate containing silicon;

forming a cap layer on the metal layer;

heating to form a layer of metal silicide;

etching to remove the cap layer;

forming a doped layer having impurities on the metal silicide layer by:

forming a first doped film comprising a first conductivity type of impurity;

providing a mask on the first doped film, the mask having openings to expose portions of the first doped film;

etching the exposed portions of the first doped film to form through-holes in the first doped film; and forming a second doped film comprising a second conductivity type of impurity on the first doped film and in the through-holes;

wherein the second conductivity type of impurity does not substantially diffuse through the first doped film during heating to diffuse the impurities into the substrate; and heating to diffuse the impurities through the metal silicide layer into the substrate to form source/drain regions having a junction depth below the metal silicide layer.

12. The method according to claim 11, wherein the first and second doped films are dielectric films comprising silicon dioxide or silicon oxynitride.

13. The method according to claim 11, wherein the first conductivity type of impurity has a higher rate of diffusion than the second conductivity type of impurity.

14. The method according to claim 13, wherein the first conductivity type of impurity comprises a p-type impurity and the second conductivity type of impurity comprises an n-type impurity.

15. The method according to claim 11, wherein the first doped film comprises silicon oxynitride or silicon nitride and the second doped film comprises silicon dioxide.

16. The method according to claim 11, further comprising forming a skin of nitrogen on the first doped film to substantially prevent the second conductivity type of impurity from diffusing through the first doped film while heating to diffuse the impurities into the substrate.

17. The method according to claim 16, wherein the first conductivity type of impurity comprises an n-type impurity and the second conductivity type of impurity comprises boron.

18. The method according to claim 17, comprising forming the nitrogen skin by annealing the first doped film in a nitrogen atmosphere.

19. The method according to claim 11, wherein a concentration of the first conductivity type of impurity in the first doped film is higher than a concentration of the second conductivity type of impurity in the second doped film, to substantially prevent the second conductivity type of impurity from diffusing through the first doped film while heating to diffuse the impurities into the substrate.

20. The method according to claim 11, wherein the first doped film has a thickness greater than a thickness of the second doped film to substantially prevent the second conductivity type of impurity from diffusing through the first doped film while heating to diffuse the impurities into the substrate.

21. The method according to claim 1, comprising:

forming conductive gates and dielectric field oxide regions on the main surface;

forming dielectric spacers on side surfaces of the gates;

forming the metal layer and the cap layer on the field oxide regions, spacers, and top surfaces of the gates; and etching to remove the metal layer and the cap layer from the field oxide regions and the spacers after forming the first-phase metal silicide layer.

22. The method according to claim 1, wherein the cap layer comprises titanium or titanium nitride.

* * * * *